(12) United States Patent
Chen (10) Patent No.: US 8,907,714 B2
(45) Date of Patent: Dec. 9, 2014

(54) SWITCHED CAPACITOR CIRCUIT WITH SWITCHING LOSS COMPENSATION MECHANISM AND COMPENSATION METHOD THEREOF

(75) Inventor: Hsien-Ku Chen, Taoyuan County (TW)

(73) Assignee: Real Tek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/470,131

(22) Filed: May 11, 2012

(65) Prior Publication Data

US 2012/0286857 A1 Nov. 15, 2012

(30) Foreign Application Priority Data

May 13, 2011 (TW) .................................. 100116838

(51) Int. Cl.
*G06G 7/12* (2006.01)
*H03H 19/00* (2006.01)
*H03H 7/03* (2006.01)
*H03H 11/06* (2006.01)

(52) U.S. Cl.
CPC ............... *H03H 19/006* (2013.01); *H03H 7/03* (2013.01); *H03H 11/06* (2013.01)
USPC .......................................................... 327/362

(58) Field of Classification Search
USPC ............. 327/554, 362, 100, 94; 331/109, 183
See application file for complete search history.

(56) References Cited

U.S. PATENT DOCUMENTS

| | | | | |
|---|---|---|---|---|
| 6,798,301 | B1 * | 9/2004 | Balan et al. | 331/74 |
| 6,812,802 | B1 * | 11/2004 | Godambe et al. | 331/183 |
| 6,815,996 | B1 * | 11/2004 | Hsiao | 327/337 |
| 6,909,336 | B1 * | 6/2005 | Rajagopalan et al. | 331/183 |
| 7,218,182 | B2 * | 5/2007 | Muramatsu | 331/177 V |
| 7,675,374 | B2 * | 3/2010 | Min et al. | 331/109 |
| 7,902,933 | B1 * | 3/2011 | Brennan | 331/158 |
| 8,093,958 | B2 * | 1/2012 | O'Day et al. | 331/182 |
| 8,269,566 | B2 * | 9/2012 | Upadhyaya et al. | 331/117 R |
| 2003/0025566 | A1 * | 2/2003 | Rogers | 331/109 |
| 2006/0077012 | A1 * | 4/2006 | Shi et al. | 331/74 |

* cited by examiner

*Primary Examiner* — Dinh Le
(74) *Attorney, Agent, or Firm* — McClure, Qualey & Rodack, LLP (57) ABSTRACT

A switched capacitor circuit with switching loss compensation mechanism includes a resonant unit and a loss compensation unit. The resonant unit generates a resonant frequency and includes a capacitor switching unit for switching an output capacitor. The loss compensation unit is coupled to the resonant unit for providing loss compensation when the capacitor switching unit outputs different capacitance values.

13 Claims, 8 Drawing Sheets

SWITCHED CAPACITOR CIRCUIT WITH SWITCHING LOSS COMPENSATION MECHANISM AND COMPENSATION METHOD THEREOF

CROSS-REFERENCE TO RELATED APPLICATION

This application claims priority to Taiwanese Application No. 100116838, filed on May 13, 2011.

BACKGROUND OF THE INVENTION

1. Field of the Invention

The invention relates to a switched capacitor circuit, and more particularly to a switched capacitor circuit with switching loss compensation mechanism.

2. Description of the Related Art

Figure 1:
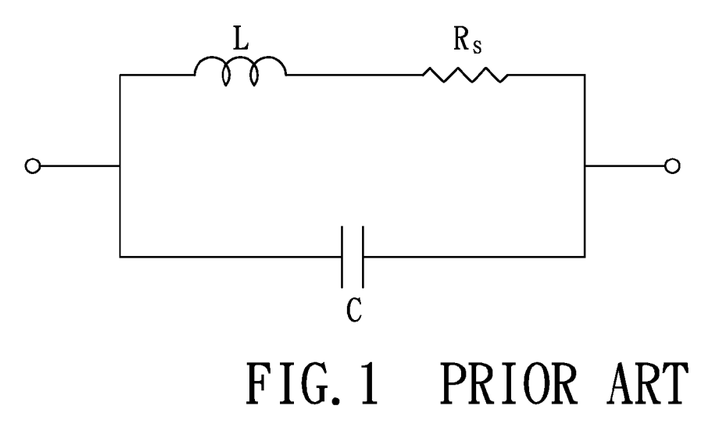
FIG. 1 is a circuit diagram showing the conventional single-ended parallel resonant circuit with loss.
Figure 2:
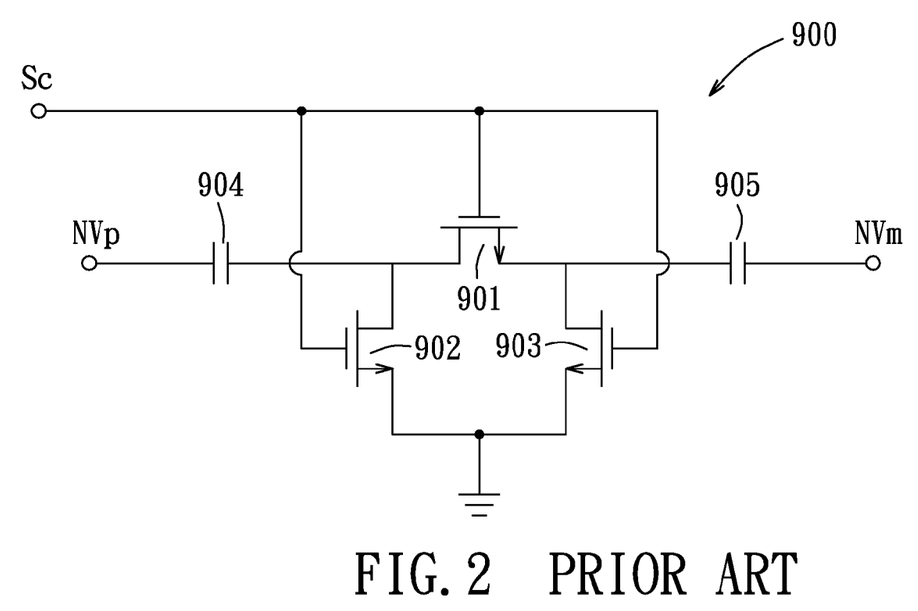
FIG. 2 is a circuit diagram showing the conventional switched capacitor circuit.

FIG. 1 shows a conventional single-ended parallel resonant circuit with loss. When the parallel resonant circuit is used as a differential circuit, the capacitor C can be realized using the switched capacitor circuit 900 as shown by FIG. 2. The conventional switched capacitor circuit 900 includes a plurality of N type transistors 901~903 and a plurality of capacitors 904~905. The switched capacitor circuit 900 is used to perform a capacitor switching action between a positive voltage terminal NVp and a negative voltage terminal NVm of a differential circuit, thereby switching equivalent capacitances of NVp and NVm relative to ground. The N type transistors 901~903 are responsive to a switching signal Sc. The parallel resonant circuit has the characteristics according to the following formula:

$$R_T = (Q)^2 \cdot R_s = \left(\frac{\omega L}{R_s}\right)^2 \cdot R_s = \left(\frac{1}{\omega C R_s}\right)^2 \cdot R_s$$

Figure 3:
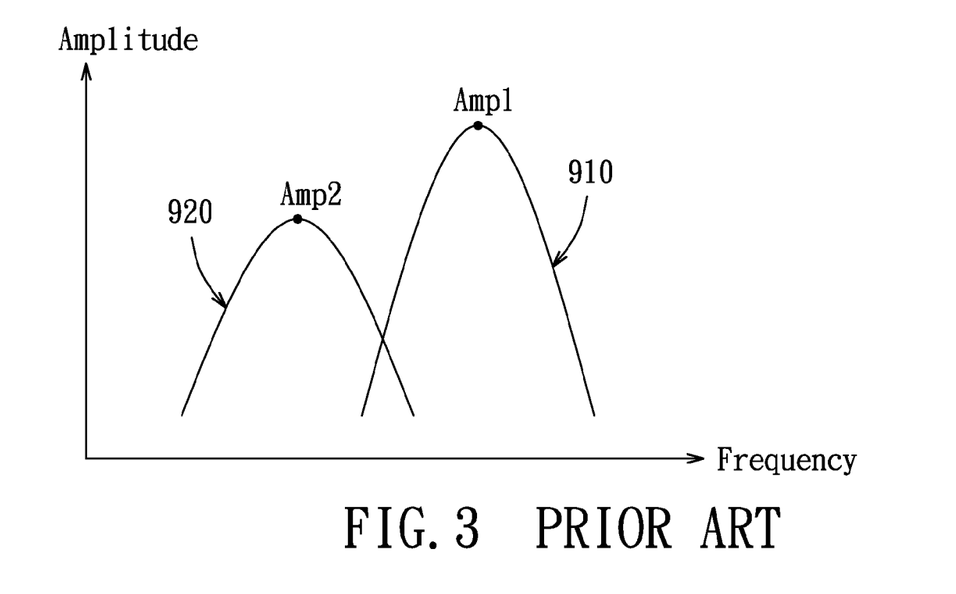
FIG. 3 is a plot of frequency response using the conventional resonant circuit of the switched capacitor circuit.

Further referring to FIG. 3, which is a frequency response of a resonant circuit in the switched capacitor circuit 900, when Sc takes the value 0, each of NVp and NVm is still connected to a capacitor (not shown). As can be seen from FIG. 3 and the above formula, when the capacitance value of the switched capacitor circuit 900 is increased, and when the switching signal Sc switches from 0 to 1, the mid-point resonant frequency of the resonant circuit decreases from fc1 to fc2, and the amplitude of the mid-point frequency decreases from Amp1 to Amp2, resulting in the difference in the amplitude on the same usable bandwidth, and further resulting in the unevenness inside the bandwidth and decrease in the operating effectiveness of the resonance of the resonant circuit.

SUMMARY OF THE INVENTION

Therefore, an object of the present invention is to provide a switched capacitor circuit with switching loss compensation mechanism that can overcome the aforesaid drawbacks of the prior art.

According to the present invention, the switched capacitor circuit comprises a resonant unit and a loss compensation unit. The resonant unit generates a resonant frequency and includes a capacitor switching unit for switching an output capacitor. The loss compensation unit is coupled to the resonant unit for providing loss compensation when the capacitor switching unit outputs different capacitance values.

Another object of the present invention is to provide a switching loss compensation method for a switched capacitor circuit.

According to the present invention, the switching loss compensation method comprises the following steps:

generating a first resonant mid-point frequency using a resonant unit and a first output capacitor of the resonant unit;

switching from the first output capacitor of the resonant unit to a second output capacitor for generating a second resonant mid-point frequency; and providing a loss compensation circuit for performing loss compensation upon one of a second resonant amplitude of the second resonant mid-point frequency and a first resonant amplitude of the first resonant mid-point frequency.

According to the present invention, when performing the capacitor switching process, loss compensation through cooperation between the loss compensation unit and the amplitude detection unit can even the mid-point frequency amplitude changes in the bandwidth, which was provided by the resonant circuit of the switched capacitor circuit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 4:
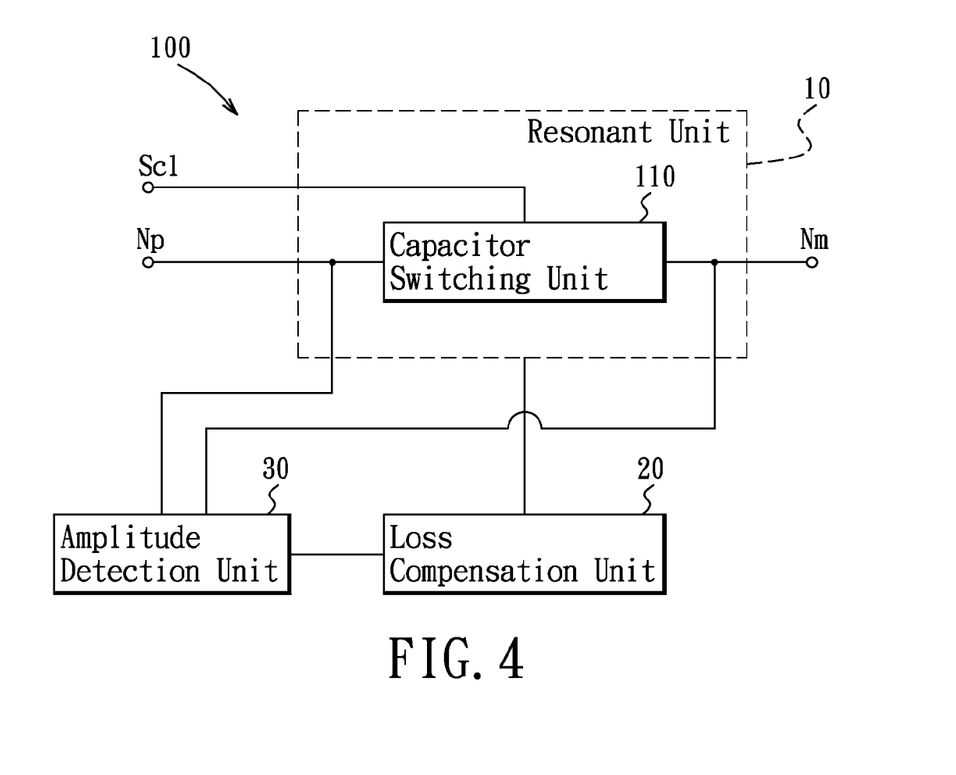
FIG. 4 is a circuit block diagram showing the first embodiment of the switched capacitor circuit with switching loss compensation mechanism of the present invention.

FIG. 4 shows the first embodiment of the switched capacitor circuit 100 with switching loss compensation mechanism of the present invention. The switched capacitor circuit 100 includes a resonant unit 10 and a loss compensation unit 20. The resonant unit 10 is a one bit capacitor switching having a capacitor switching unit 110, which can be coupled with an inductor and a resistor (not shown) to create a resonant frequency. The capacitor switching unit 110 has a first terminal Np and a second terminal Nm, and is responsive to a switching signal Sc1 to switch the output capacitor of the first terminal Np and the second terminal Nm. When the switching signal Sc1 is of low potential, each of Np and Nm is still connected to a capacitor (not shown). The loss compensation unit 20 is coupled to the resonant unit 10, and provides a loss compensation when the capacitor switching unit 110 outputs different capacitance values. Another embodiment of the present invention may include an amplitude detection unit 30. The amplitude detection unit 30 is coupled to the resonant unit 10 and the loss compensation unit 20, and is used to detect a resonant amplitude of the resonant frequency created by the resonant unit 10, allowing the loss compensation unit 20 to provide loss compensation based on the detected results.

Figure 5:
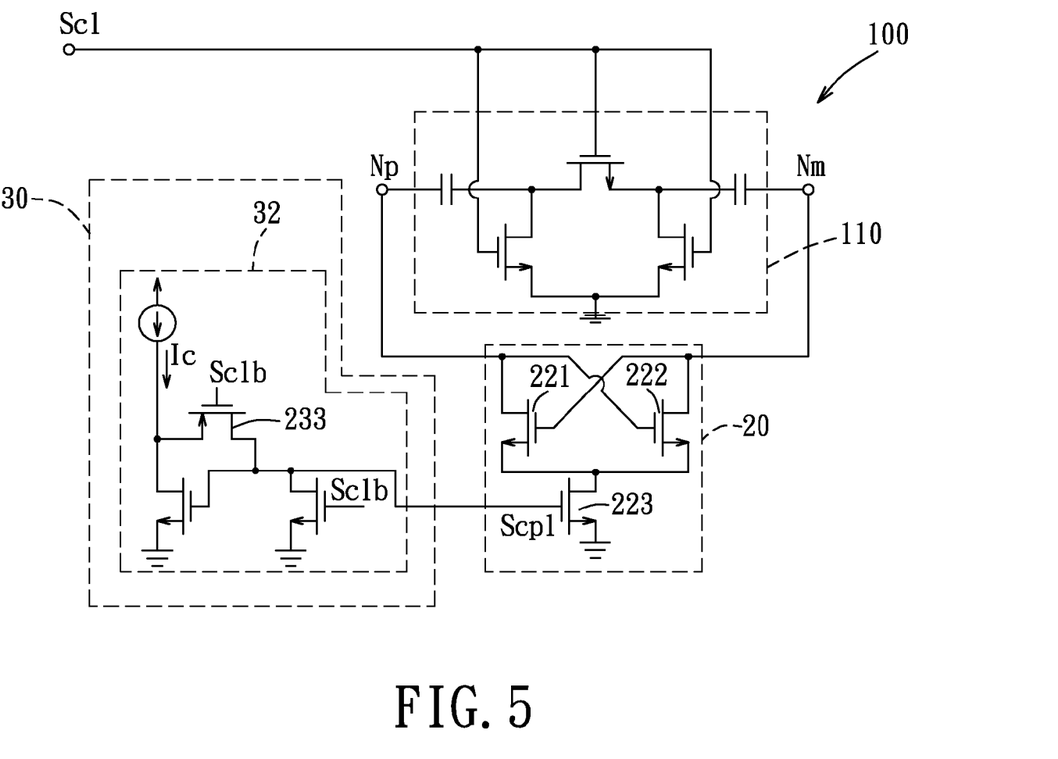
FIG. 5 is a circuit diagram showing the internal circuit configuration of the switched capacitor circuit of the first embodiment.

FIG. 5 shows the internal circuit of the switched capacitor circuit 100 in the present embodiment. Capacitor switching unit 110 is responsive to the first switching signal Sc1 to switch capacitors. When the first switching signal Sc1 is high in potential, the output capacitance of the first terminal Np and the second terminal Nm is larger.

The loss compensation unit 20 includes a first compensation transistor 221, a second compensation transistor 222 (the two transistors couple to form a cross-coupled transistor pair), and a third compensation transistor 223. The gate of the first compensation transistor 221 and the drain of the second compensation transistor 222 are electrically coupled to the second terminal Nm. The gate of the second compensation transistor 222 and the drain of the first compensation transistor are electrically coupled to the first terminal Np. The sources of the first and second transistors 221, 222 are electrically coupled to the drain of the third compensation transistor 223. The gate of the third compensation transistor 223 is disposed to receive a first compensation drive signal Scp1. The source of the third compensation transistor 223 is connected to ground.

The amplitude detection unit 30 includes a compensation drive signal generating unit 32 to generate the first compensation drive signal Scp1. The compensation drive signal generating unit 32 can be a current mirror structure, and generates the first compensation drive signal Scp1 in response to a first switching signal Sc1b. FIG. 5 shows how the components are interconnected, the transistor 233 being a P-type transistor. The first switching signal Sc1b can be the complementary signal of the switching signal Sc1. That is, when the switching signal Sc1 has low potential, the first switching signal Sc1b has high potential, and the first compensation drive signal Scp1 has low potential and shuts down the third compensation transistor 223, stopping the operation of the cross-coupled transistor pair. On the other hand, when the switching signal Sc1 has high potential, the first compensation drive signal Scp1 is at a potential that makes the third compensation transistor 223 conduct, allowing the cross-coupled transistor pair to create a negative impedance to compensate for the lesser resonant amplitude when the output capacitor is greater while the resonant frequency is lesser. Because of the switching signal Sc1, the output capacitor is switched and the cross-coupled transistor pair is activated. The first switching signal Sc1b can be independent of the switching signal Sc1, and with the result of the resonant amplitude detected by the amplitude detection unit 30, and by adjusting the magnitude of the current source Ic to adjust the current flowing through the cross-coupled transistor pair, loss compensation is provided to different resonant amplitudes of the resonant frequency. The compensation drive signal generating unit 32 can be a high resolution digital-to-analog converter (DAC) which, according to the detection result of the amplitude detection unit 30, provides a substantially more precise first compensation drive signal Scp1, and by substantially more precise adjustments in the current flowing through the cross-coupled transistor pair via the third compensation transistor 223, a substantially more precise compensation to the resonant amplitude is obtained.

When the potential of the first terminal Np is greater than the potential of the second terminal Nm, the second compensation transistor 222 will conduct and the first compensation transistor 221 will be cut off such that the compensation current generated by the third compensation transistor 223 can compensate the resonant current that flows at the second terminal Nm, which has relatively lower potential. On the other hand, when the potential of the second terminal Nm is greater than the potential of the first terminal Np, the first compensation transistor 221 will conduct and the second compensation transistor 222 will be cut-off, such that the compensation current can compensate the resonant current that flows at the first terminal Np, which has relatively lower potential. Therefore, the detected result of the amplitude detection unit 30, and the compensation current or negative impedance provided by the loss compensation unit 20 can compensate the switching loss of the capacitor switching unit 110, allowing a substantially more stable value in the amplitude of the different mid-point resonant frequencies of the resonant unit 10.

For example, when the capacitor switching unit 110 switches from a first capacitor to a second capacitor that has a capacitance value greater than the first capacitor, and when a second resonant amplitude of a second resonant mid-point frequency of the second capacitor is less than a first resonant amplitude of a first resonant mid-point frequency of the first capacitor, the loss compensation unit 20 will increase the current flowing into the cross-coupled transistor pair to increase the second resonant amplitude of the second capacitor, thus making the resonant mid-point frequency amplitudes of the first and second capacitors substantially equal.

In other words, the switching loss compensation method applicable to the switched capacitor circuit 100 of the present invention has the resonant unit 10 and a first output capacitor creating a first resonant mid-point frequency. The resonant unit 10 then switches from the first output capacitor to a second output capacitor to generate a second resonant mid-point frequency. At the same time, a loss compensation unit 20 performs a loss compensation for a second resonant amplitude of the second resonant mid-point frequency or a first resonant amplitude of the first resonant mid-point frequency. Thus, the capacitor switching loss of the capacitor switching unit 110 is compensated, maintaining the mid-point resonant frequency and the amplitude thereof of the resonant unit 10 substantially at the same level.

It should be noted that the internal circuit configuration of the loss compensation unit 20 is not restricted to the disclosed embodiment as long as switching loss compensation is provided based on the output capacitance of the capacitor switching unit 110.

Figure 6:
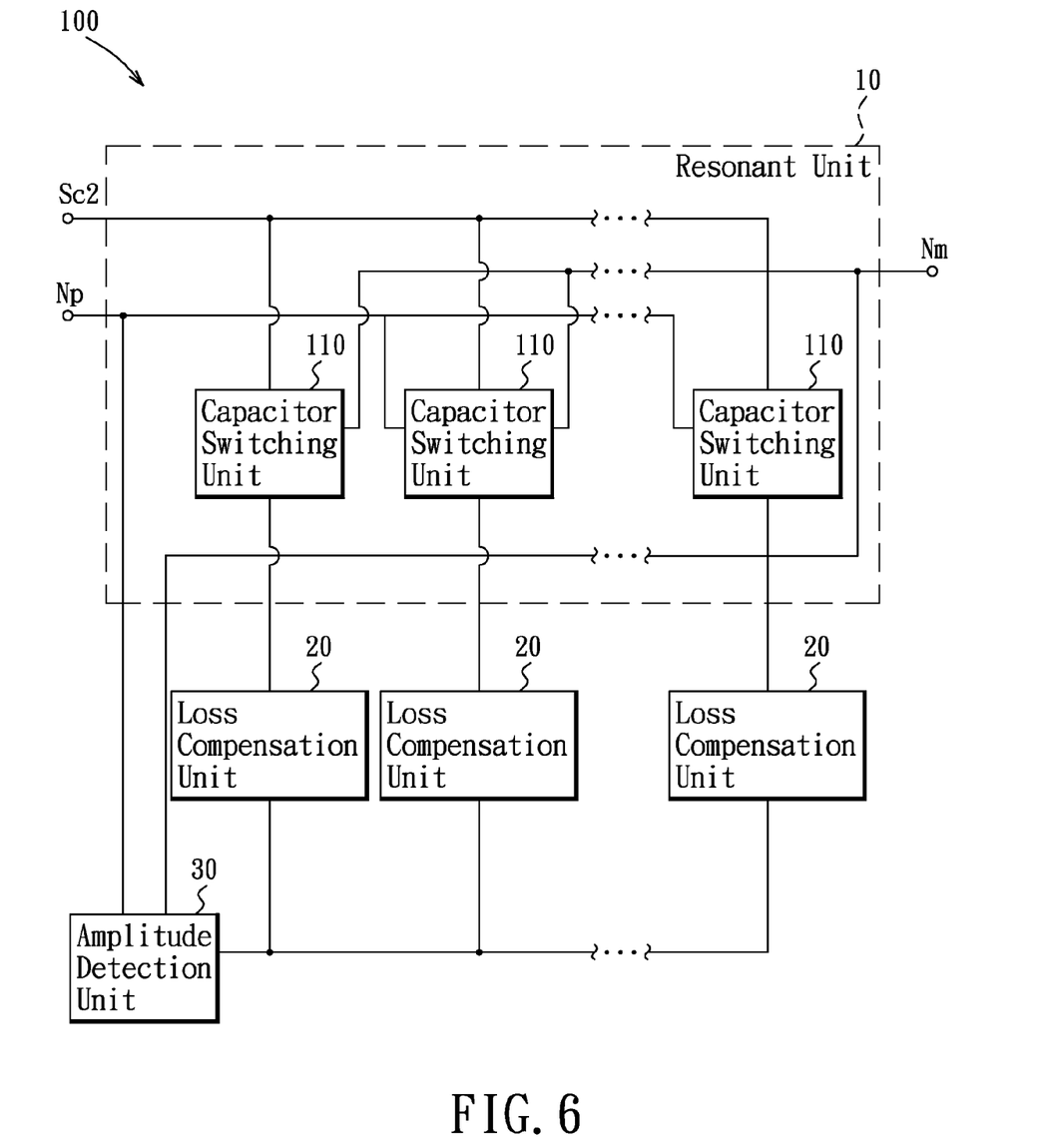
FIG. 6 is a circuit block diagram showing the second embodiment of the switched capacitor circuit with switching loss compensation mechanism of the present invention.

FIG. 6 shows the second embodiment of the switched capacitor circuit 100 with switching loss compensation mechanism of the present invention. The difference from the first embodiment is that the resonant unit 10 of the second embodiment has multiple bit capacitor switching, which means there is a plurality of capacitor switching units 110 and responsive to a plurality of second switching signals Sc2 to switch to the output capacitor at one of the first terminal Np and the second terminal Nm. The number of loss compensation units 20 corresponds to the number of capacitor switching units 110.

Figure 7:
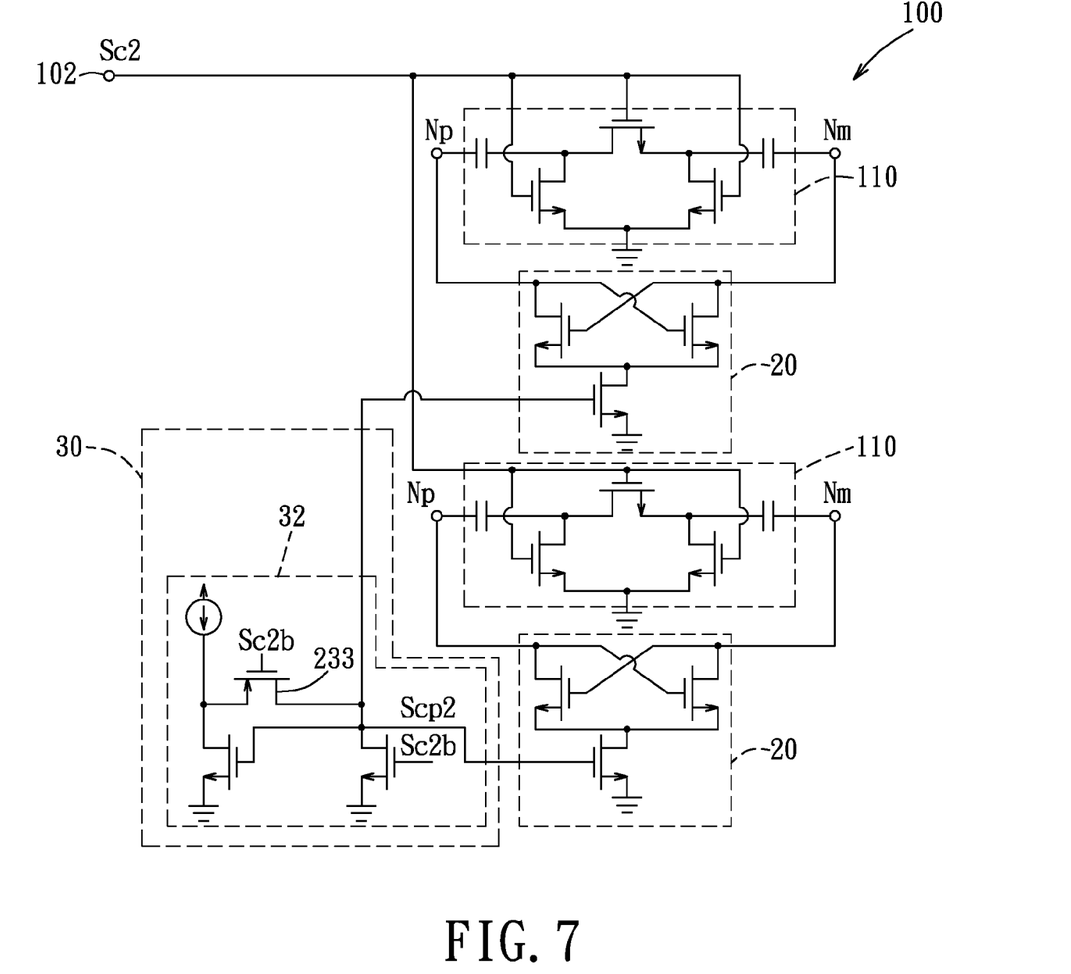
FIG. 7 is a circuit diagram showing the internal circuit configuration of the switched capacitor circuit of the second embodiment.

FIG. 7 shows the resonant unit 10 of a two bit capacitor switching, wherein two capacitor switching units 110 perform capacitor switching according to the second switching signal Sc2, allowing the equivalent capacitance to switch between the first terminal Np and the second terminal Nm. As the circuit configurations of two capacitor switching units 110, two loss compensation units 20 and an amplitude detection unit 30 is the similar to the first embodiment, details thereof will not be repeated herein.

Similarly, when the output capacitance of the first terminal Np and the second terminal Nm of two capacitor switching units 110 change, the capacitor switching loss of the capacitor switching units 110 can be compensated by the compensation currents provided by the two loss compensation units 20. Thus, a smoother amplitude variation of the mid-point frequency bandwidth is provided by the resonant unit 10.

Figure 8:
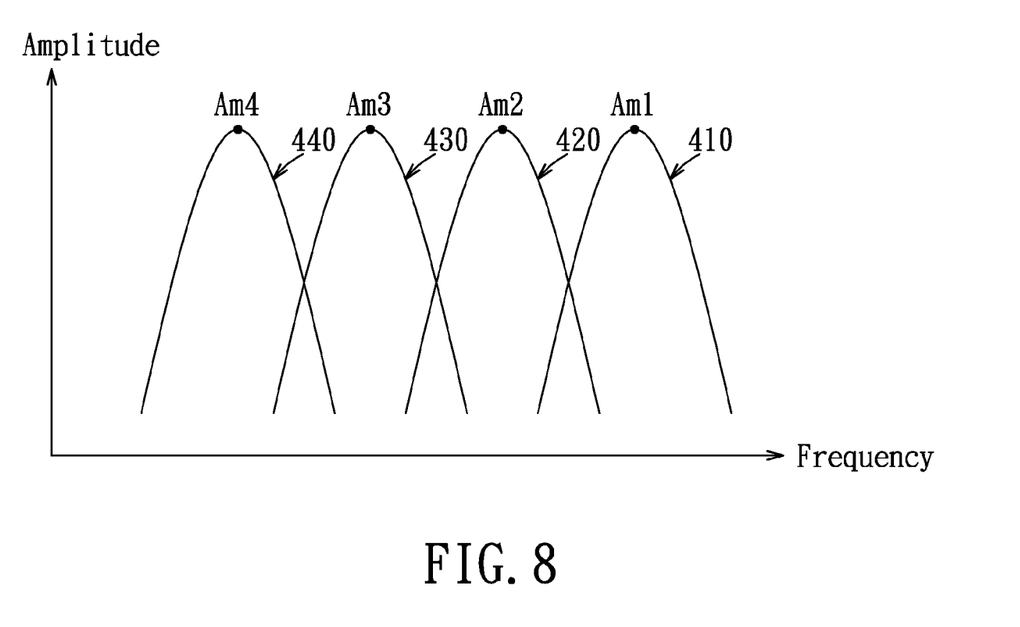
FIG. 8 is a plot of frequency response using the resonant circuit of the switched capacitor circuit of the first and second embodiments.

FIG. 8 shows the frequency response using the resonant unit 10 in the switched capacitor circuit 100 of the first and second embodiments. The bandwidth 410 having the resonant circuit mid-point frequency amplitude Am1 is the frequency response when (Sc2,Sc1) is (0,0). The bandwidth 420 having the resonant circuit mid-point frequency amplitude Am2 is the frequency response when (Sc2,Sc1) is (0,1). The bandwidth 430 having the resonant circuit mid-point frequency amplitude Am3 is the frequency response when (Sc2, Sc1) is (1,0). The bandwidth 440 having the resonant circuit mid-point frequency amplitude Am4 is the frequency response when (Sc2,Sc1) is (1,1).

As shown in FIG. 8, the magnitude of the mid-point frequency amplitudes Am1-Am4 are substantially the same amplitude under the mechanism of the switching loss compensation performed by the switched capacitor circuit 100. In other words, when the switched capacitor circuit 100 performs capacitor switching, increasing or decreasing the output capacitance of the first terminal Np and the second terminal Nm, through the performance of the switching loss compensation mechanism, the mid-point frequency amplitudes Am1-Am4 of the bandwidths 410-440 can be maintained at substantially the same amplitude.

Figure 9:
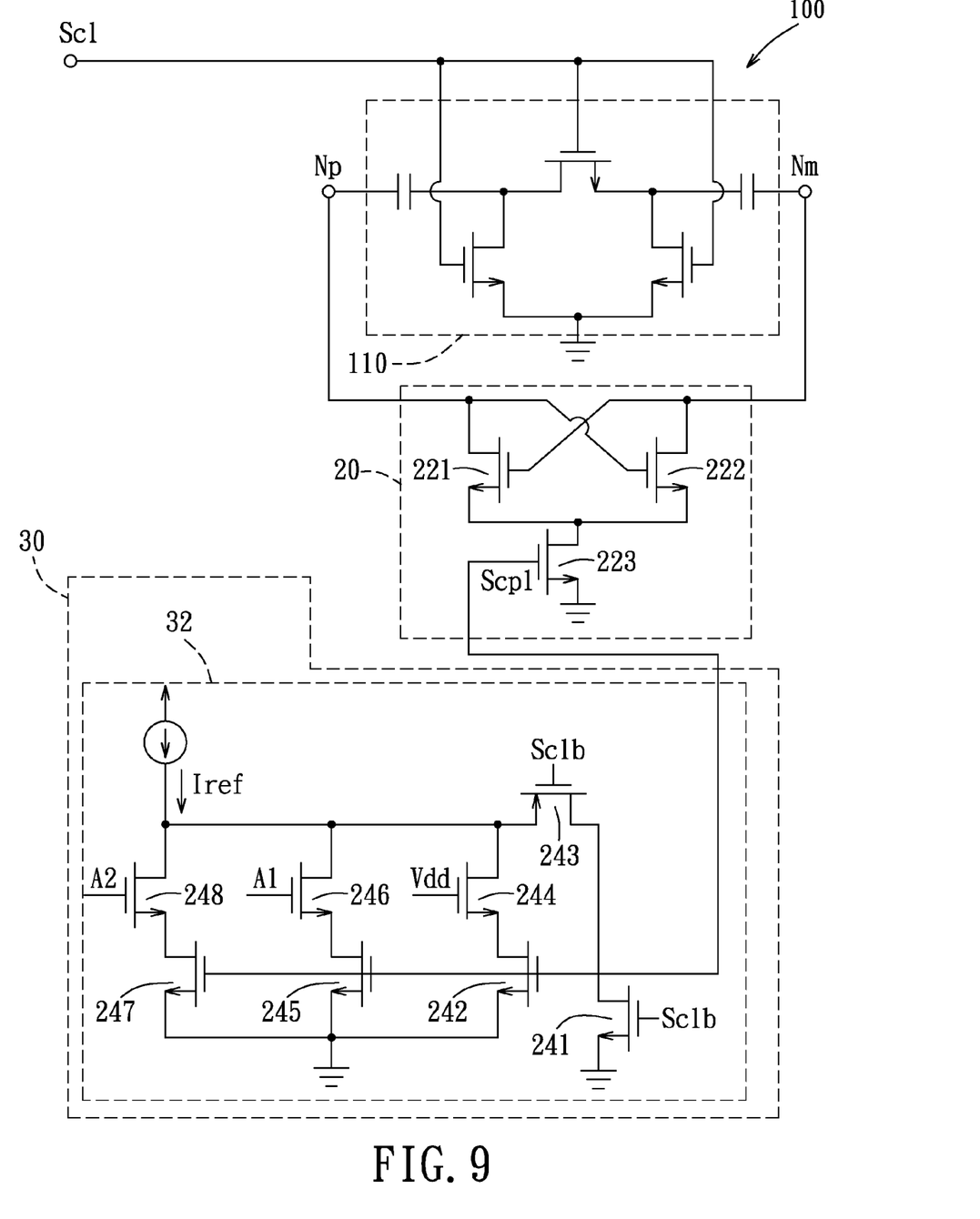
FIG. 9 is a circuit diagram showing the third embodiment of the switched capacitor circuit with switching loss compensation mechanism of the present invention.

FIG. 9 is the third embodiment of the switched capacitor circuit 100 with switching loss compensation mechanism of the present invention. The difference from the first embodiment is that the compensation drive signal generating unit 32 includes a first transistor 241, a second transistor 242, a third transistor 243, a fourth transistor 244, a fifth transistor 245, a sixth transistor 246, a seventh transistor 247, an eighth transistor 248, and a reference current source 249. The reference current source 249 provides a reference current Iref. The third transistor 243 is controlled by the first switching signal Sc1b. The sixth transistor 246 is controlled by a first control signal A1. The eighth transistor 248 is controlled by a second control signal A2. The circuit configuration is as shown in FIG. 9, and will not be described here. The third transistor 243 is a P-type transistor. It is noted that the compensation drive signal generating unit 32 in the amplitude detection unit 30 of the present embodiment can also be used in the two bit switched capacitor circuit according to the second embodiment.

Figure 10:
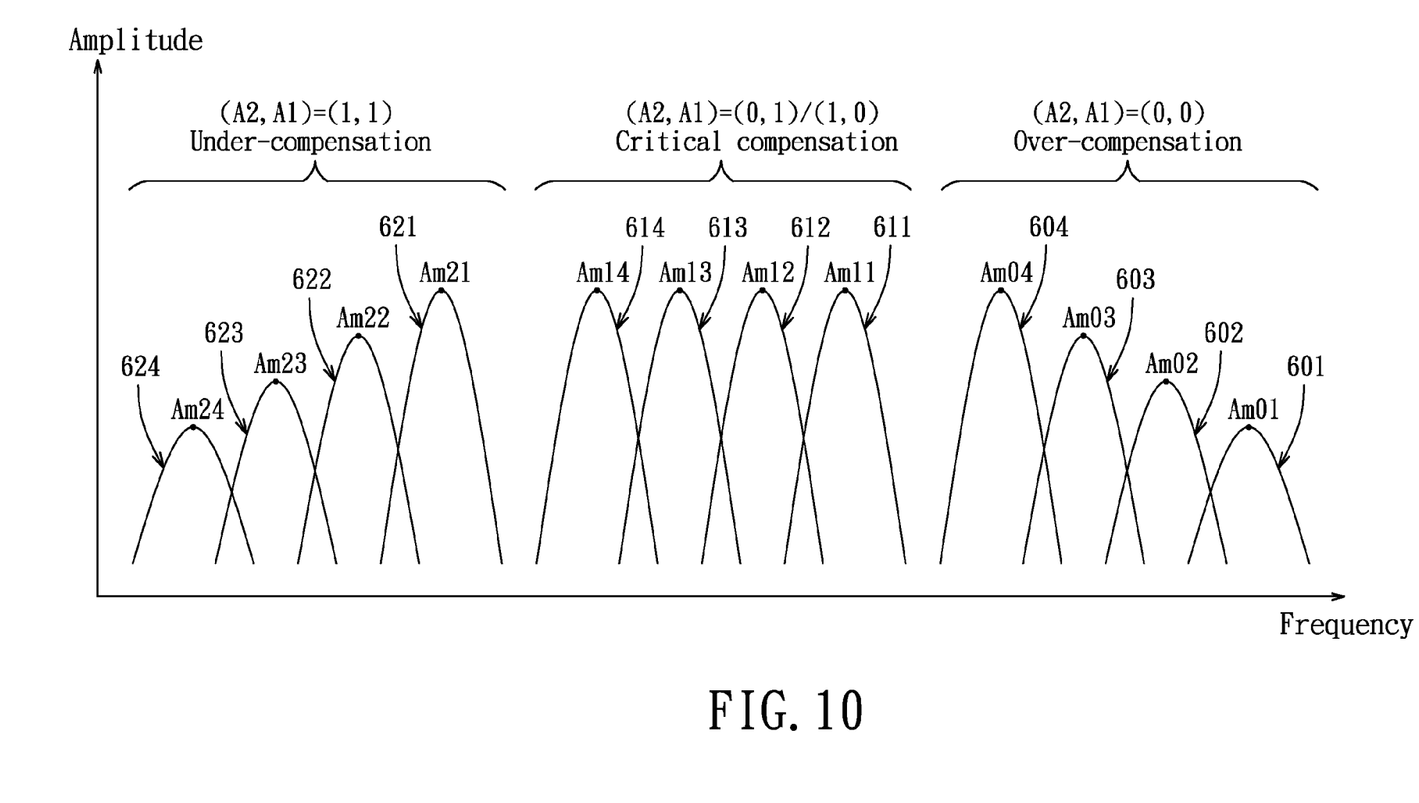
FIG. 10 is a plot of frequency response using the resonant circuit of the two bit switched capacitor circuit of the compensation drive signal generating unit in the third embodiment.

FIG. 10 shows the frequency response of the resonant circuit of the two bit switched capacitor circuit 100 using the compensation drive signal generating unit 32 of the present embodiment. Referring to FIG. 7, FIG. 9 and FIG. 10, the bandwidth 601-604 is the frequency response when (A2,A1) is (0,0). The bandwidth 611-614 is the frequency response when (A2,A1) is (0,1) or (1,0). The bandwidth 621-624 is the frequency response when (A2,A1) is (1,1). The bandwidth 601, 611, 621 is the frequency response when (Sc2,Sc1) is (0,0). The bandwidth 602, 612, 622 is the frequency response when (Sc2,Sc1) is (0,1). The bandwidth 603, 613, 623 is the frequency response when (Sc2,Sc1) is (1,0). The bandwidth 604, 614, 624 is the frequency response when (Sc2,Sc1) is (1,1).

When (A2,A1) is (0,0), the loss compensation unit 20 provides the greatest first compensation current to perform over-compensation operation. When the switched capacitor circuit 100 performs capacitor switching, the mid-point frequency amplitude Am01-Am04 corresponding to the bandwidth 601 to 604 increases each time the output capacitance of the first terminal Np and the second terminal Nm increases.

When (A2,A1) is (0,1) or (1,0), the loss compensation unit 20 provides the critical second compensation current to perform critical compensation operation. When the switched capacitor circuit 100 performs capacitor switching, the magnitude of the mid-point frequency amplitude Am11-Am14 corresponding to the bandwidth 611 to 614 is maintained at the same level even though the output capacitance of the first terminal Np and the second terminal Nm is increased.

When (A2,A1) is (1,1), the loss compensation unit 20 provides the smallest third compensation current to perform under-compensation operation. When the switched capacitor circuit 100 performs capacitor switching, the mid-point frequency amplitude Am21-Am24 corresponding to the bandwidth 621 to 624 decreases each time the output capacitance of the first terminal Np and the second terminal Nm decreases.

As described above, when the switched capacitor circuit 100 of the present invention performs capacitor switching operation, with the switching loss compensation through the cooperation of the loss compensation unit 20 and the amplitude detection unit 30, the amplitude of the mid-point frequency can be smooth in a bandwidth by using the resonant unit 10 of the switched capacitor circuit 100.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A switched capacitor circuit with switching loss compensation mechanism, said switched capacitor circuit comprising:
    a resonant unit for generating a resonant frequency, said resonant unit comprising a capacitor switching unit having a plurality of transistors that are controllable to vary an effective capacitance across a pair of nodes via a switching signal;
    a compensation driving signal generating unit comprising a plurality of transistors coupled to a complementary signal of the switching signal for generating a compensation drive signal responsive to said switching signal; and
    a loss compensation unit, coupled to said resonant unit, for providing loss compensation in response to said capacitor switching unit outputting different values of the effective capacitance across the pair of nodes, the loss compensation unit providing loss compensation based on the compensation drive signal.

2. The switched capacitor circuit with switching loss compensation mechanism as claimed in claim 1, further comprising: an amplitude detection unit, coupled to said resonant unit and said loss compensation unit, for detecting a signal amplitude of a midpoint resonant frequency; wherein said loss compensation unit provides the loss compensation according to a detection by said amplitude detection unit.

3. The switched capacitor circuit with switching loss compensation mechanism as claimed in claim 1, wherein said loss compensation unit includes a cross-coupled transistor pair, said switched capacitor circuit performing the loss compensation by adjusting a current flowing through said cross-coupled transistor pair.

4. The switched capacitor circuit with switching loss compensation mechanism as claimed in claim 3, wherein, when said capacitor switching unit switches from a first capacitor to a second capacitor, and when a second signal amplitude of a second mid-point resonant frequency of the second capacitor is less than a first signal amplitude of a first mid-point resonant frequency of the first capacitor, the loss compensation is performed to raise the second signal amplitude.

5. The switched capacitor circuit with switching loss compensation mechanism as claimed in claim 4, wherein said switched capacitor circuit raises the second signal amplitude by increasing the current flowing through said cross-coupled transistor pair.

6. The switched capacitor circuit with switching loss compensation mechanism as claimed in claim 3, wherein said capacitor switching unit has a first terminal and a second terminal, and said capacitor switching unit is responsive to a switching signal to switch the output capacitor of said first terminal and said second terminal.

7. The switched capacitor circuit with switching loss compensation mechanism as claimed in claim 6, wherein said cross-coupled transistor pair includes a first compensation transistor and a second compensation transistor, said loss compensation unit further including a third compensation transistor, a gate of said first compensation transistor and a drain of said second compensation transistor being electrically connected to said second terminal, a gate of said second compensation transistor and a drain of said first compensation transistor being electrically connected to said first terminal, sources of both said first compensation transistor and said second compensation transistor being electrically connected to a drain of said third compensation transistor, a gate of said third compensation transistor being disposed to receive the compensation drive signal for providing the loss compensation.

8. The switched capacitor circuit with switching loss compensation mechanism as claimed in claim 7, wherein the loss compensation is performed through adjusting a voltage of the compensation drive signal.

9. A switching loss compensation method for a switched capacitor circuit, said switching loss compensation method comprising:
generating a first mid-point resonant frequency by a resonant unit comprising a first effective output capacitance;
generating a switching signal to controllably change controllably changing from the first effective output capacitance of the resonant unit to a second effective output capacitance for generating a second mid-point resonant frequency;
generating a compensation drive signal responsive to said switching signal based on a complementary signal of the switching signal;
providing a loss compensation circuit for performing loss compensation upon one of a second signal amplitude of the second mid-point resonant frequency and a first signal amplitude of the first mid-point resonant frequency according to the compensation drive signal.

10. The switching loss compensation method as claimed in claim 9, further comprising: detecting the first signal amplitude and the second signal amplitude, the loss compensation being provided according to the detected first and second signal amplitudes.

11. The switching loss compensation method as claimed in claim 9, wherein the loss compensation circuit includes a cross-coupled transistor pair, and the loss compensation is performed through adjusting current flowing through the cross-coupled transistor pair.

12. The switching loss compensation method as claimed in claim 11, wherein when the second signal amplitude is less than the first signal amplitude, the loss compensation is performed to raise the second signal amplitude.

13. The switching loss compensation method as claimed in claim 12, wherein the second signal amplitude is raised through raising the current flowing through the cross-coupled transistor pair.

* * * * *